United States Patent [19]

Soda et al.

[11] Patent Number: 4,701,940
[45] Date of Patent: Oct. 20, 1987

[54] LINEARLY POLARIZED X-RAY PATTERNING PROCESS

[75] Inventors: Yasunari Soda, Kokubunji; Kozo Mochiji, Hachioji; Takeshi Kimura, Higashimurayama, all of Japan; Hidehito Obayashyi, Burlingame, Calif.

[73] Assignee: Hitachi, Ltd., Tokyo, Japan

[21] Appl. No.: 790,116

[22] Filed: Oct. 22, 1985

[30] Foreign Application Priority Data

Oct. 22, 1984 [JP] Japan ................................ 59-220557

[51] Int. Cl.[4] ............................................. G21K 5/00
[52] U.S. Cl. ....................................... 378/34; 378/35; 378/145
[58] Field of Search ..................... 378/34, 35, 70, 145

[56] References Cited

U.S. PATENT DOCUMENTS

| | | | |
|---|---|---|---|
| 3,944,822 | 3/1976 | Dzubay | 378/145 |
| 4,028,547 | 6/1977 | Eisenberger | 378/34 |
| 4,320,936 | 3/1982 | Sawamura | 378/1.6 |
| 4,370,194 | 1/1983 | Shaver et al. | 350/341 |
| 4,467,026 | 8/1984 | Ogawa | 378/34 |

Primary Examiner—Janice A. Howell
Attorney, Agent, or Firm—Antonelli, Terry & Wands

[57] ABSTRACT

A process of X-Y lithography including providing a linearly polarized X-ray, and irradiating a resist on a substrate through a mask with the linearly polarized X-ray to form a pattern shape which is utilized for production of, for example, a semiconductor device or magnetic bubble memory device.

5 Claims, 10 Drawing Figures

LINEARLY POLARIZED X-RAY PATTERNING PROCESS

BACKGROUND OF THE INVENTION

The present invention relates to a patterning process using an X-ray i.e., a process of X-ray lithography.

In a patterning process using an X-ray, the influence of emission of a photoelectron or a Auger electron caused by absorption of the X-ray on irradiation objects must be taken into consideration. For example, when an X-ray is radiated to an electron beam resist to form a pattern, the resist is exposed to secondary electrons emitted from irradiation objects, so the pattern formed becomes bad in quality. According to Yasunao Saitoh et al, "J. Vac. Sci. Technol. B," Vol. 2, No. 1, Jan.-Mar., 1984, p. 63-p. 67, the influence of secondary electrons from a substrate is prevented by using a multi-layer resist. However, although this method is effective against the emission of secondary electrons from a substrate, it is not effective against the influence of secondary electrons emitted from a resist or mask. Besides, the multi-layer resist method is disadvantageous in that a more complicated process is required.

SUMMARY OF THE INVENTION

It is the object of the present invention to provide a patterning process capable of forming replicate fine patterns in high resolution.

According to the patterning process of the present invention, by the using a linearly polarized X-ray, the emitting direction of secondary electrons from a substrate, resist and/or mask during radiation of the X-ray is fixed, consequently the influence of such secondary electrons is diminished. FIG. 7 shows characteristic of a photoelectron emission of K-shell electrons in the radiation of a linearly polarized X-ray. A linearly polarized incident X-ray 1 is assumed to be one in which its electric vector has a linear polarization in the direction indicated at 3. At point 4 the X-ray 1 is absorbed and a photoelectron e$^-$ is emitted. If the angle between the emitting direction 2 of the photoelectron e$^-$ and an advancing direction of the linearly polarized incident X-ray 1 is $\theta$ and the angle between the photoelectron emitting direction 2 as projected on a plane perpendicular to the linearly polarizd incident X-ray and the electric vector direction 3 is $\phi$, the probability of photoelectrons being emitted in each direction is expressed approximately as $I(\theta, \phi) \alpha \sin^2 \theta \cos^2 \phi$. Thus, the largest number of photoelectrons are emitted in the electric vector direction 3. In forming a pattern, therefore, a good pattern can be formed by fixing the electric vector direction 3 to a direction perpendicular to a direction in which a high accuracy is required. In other words, the patterning process of the present invention is characterized by using a linearly polarized X-ray.

DETAILED DESCRIPTION OF THE PREFERRED EMBODIMENTS

Embodiments of the present invention will be described hereinunder with reference to the accompanying drawings.

EMBODIMENT 1

Figure 1:
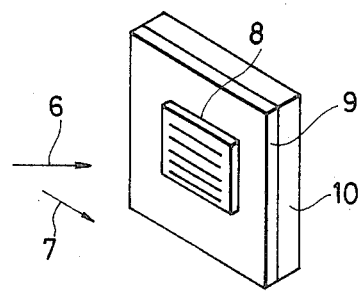
FIG. 1 illustrates Embodiment 1 of a patterning process according to the present invention.
Figure 2A:
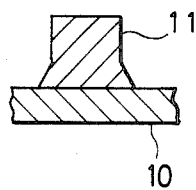
FIGS. 2a and 2b are sectional views of diffraction gratings, FIG. 2a being of a conventional diffraction grating and FIG. 2b of a diffraction grating formed according to the above embodiment.
Figure 2B:
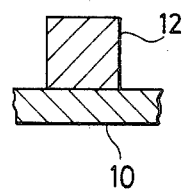
Figure 3A:
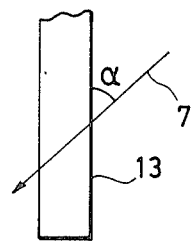
FIG. 3a and 3b illustrate an angular dependence of pattern broadening width, FIG. 3a illustrating a relation between a line pattern and an electric vector and FIG. 3b illustrating a relation between an angle $\alpha$ of an electric vector relative to a line pattern and a broadening width.
Figure 3B:
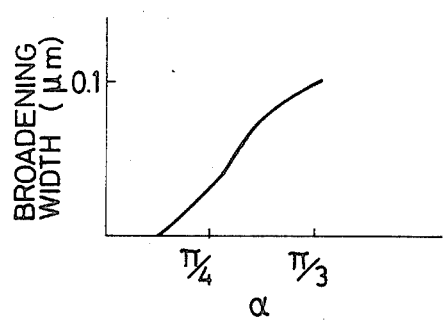
Figure 4:
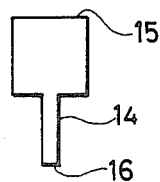
FIG. 4 illustrates a mask pattern in Embodiment 2 of the present invention.
Figure 5:
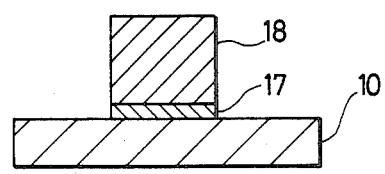
FIG. 5 is a sectional view of a line pattern in Embodiment 3 of the present invention.
Figure 6A:
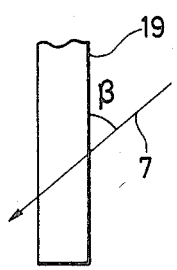
FIGS. 6a and 6b illustrate an angular dependence of the quantity of photoelectrons emitted in the above embodiment, FIG. 6a illustrating a relation between a line pattern and an electric vector and FIG. 6b illustrating a relation between an angle $\beta$ of an electric vector relative to a line pattern and the quantity of photoelectrons emitted.
Figure 6B:
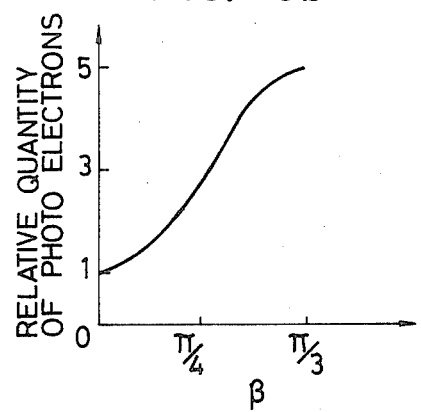
Figure 7:
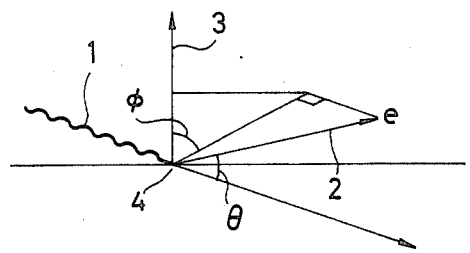
FIG. 7 illustrates an angular dependence of photoelectrons emitted.

FIG. 1 illustrates Embodiment 1 of a patterning process according to the present invention; FIGS. 2a and 2b are sectional views of diffraction gratings, FIG. 2a being a sectional view of a conventional diffraction grating formed by an electron impact X-ray tube and FIG. 2b being a sectional view of a diffraction grating formed by an X-ray source according to the present invention; FIGS. 3a and 3b illustrate an angular dependence of pattern broadening width, FIG. 3a illustrating a relation between a line pattern and an electric vector and FIG. 3b illustrating a relation between an angle $\alpha$ of an electric vector relative to a line pattern and a broadening width; FIG. 4 illustrates a mask pattern in Embodiment 2 of the present invention; FIG. 5 is a sectional view of a line pattern in Embodiment 3 of the present invention; and FIGS. 6a and 6b illustrate an angular dependence of the quantity of photoelectrons emitted in the above embodiment, FIG. 6a illustrating a relation between a line pattern and an electric vector and FIG. 6b illustrating a relation between an angle $\beta$ of an electric vector relative to a line pattern and the quantity of photoelectrons emitted.

In FIG. 1, a linearly polarized X-ray 6 was directed through a mask 8 to a resist 9 coated on a substrate 10. As the linearly polarized X-ray there was used a synchrotron radiation (hereinafter referred to as "SR"). The electron energy at a storage ring is 1 GeV. An electric vector direction 7 was fixed horizontally. In the mask 8, a membrane comprises boron nitride (BN) (3 $\mu$m in film thickness) and polyimide (PIQ) (1 $\mu$m in film thickness); an absorber is formed of gold (Au) (1 $\mu$m in film thickness); and a protection layer is formed of PIQ (1 $\mu$m in film thickness). The pattern is a diffraction grating of 1 $\mu$m pitch, the pitch direction intersecting the electric vector direction 7 of the X-ray perpendicularly. The resist 9 has a 1 $\mu$m thick coating of a micro resist for short wavelength (MRS) (trade name: RD20000N, a product of Hitachi Chemical Co., Ltd.). The substrate 10 is a silicon substrate. After irradiation of SR at a rate of 65 mJ/cm$^2$, a pattern was formed by development. In the case of using an unpolarized X-ray source such as an electron impact X-ray tube, there is obtained such a sectional shape of line pattern as shown in FIG. 2a in which the bottom of a resist 11 broadens about 0.1 $\mu$m. On the other hand, according to this embodiment of the present invention there is obtained a good sectional shape of a resist 12 as shown in FIG. 2b. FIG. 3 shows how the resist broadening width changes with change of the angle α between a line pattern 13 of the diffraction grating and the electric vector direction 7, from which it is seen that the broadening with decreases as the angle α becomes smaller. Also when magnetic materials (e.g. YIG (yhtrium iron garnet), GGG (gallium gadolinium iron garnet)) were used for the substrate, there were obtained the same results.

EMBODIMENT 2

In this embodiment there was used the same optical system as in the above first embodiment except that such a shape of a mask pattern as shown in FIG. 4 was used. This pattern corresponds to one used in the production of a gate of MOS transistor. It is necessary that the pattern formation be effected accurately on both side portions of a projection 14 of the pattern. Therefore, the longitudinal direction of the pattern and the direction of the electric vector were brought into coincidence with each other and in this state there was performed exposure followed by development. The pattern thus formed was good on both side portions of the projection 14 although broadening occured at both end sides 15 and 16 of the pattern.

EMBODIMENT 3

In the above two embodiments the influence of photoelectrons in pattern formation was observed, while in this Embodiment 3 photoelectrons per se created at the time of pattern formation are counted. More specifically, SR was applied to a line resist having such a sectional shape as shown in FIG. 5 and the quantity of photoelectrons emitted was measured. The line pattern was formed by laminating a 1 μm thick resist MRS 18 onto a 0.2 μm thick tungsten (W) 17 with a width of 2 μm and a length of 2 mm formed on the silicon substrate 10. The quantity of photoelectrons emited from the tungsten of a high absorption coefficient to the right and left of the line pattern corresponds to the cause of the pattern deterioration in the foregoing Embodiments 1 and 2. FIG. 6 shows how the quantity of photoelectrons change with change in the electric vector direction 7 of SR. If the angle between the line pattern 19 and the electric vector direction 7 is β, the quantity of photoelectrons emitted decreases as the angle β becomes smaller.

According to the patterning process of the present invention, as set forth hereinabove, there is used a linearly polarized X-ray to restrict the emitting direction of photoelectrons created upon irradiation of X-ray and the direction of the electric vector of the linearly polarized X-ray is adjusted relative to the pattern shape to reduce the influence of photoelectrons, whereby a good pattern can be formed. Particularly, in a one-dimensional shape pattern (Embodiment 1), the foregoing influence of photoelectrons can be eliminated nearly completely, and in a two-dimensional shape pattern (Embodiment 2), an effective pattern can be formed by making the line direction and the electric vector direction intersect each other while taking note of only the portion where a highly accurate pattern formation is required. The present invention is suitable for production of a semiconductor device and a magnetic bubble memory device, for example.

What is claimed is:

1. A process of X-ray lithography, comprising the steps of providing a linearly polarized X-ray, and irradiating a resist on a substrate through a mask with the linearly polarized X-ray to form a pattern shape with high accuracy, the step of irradiating including controlling the direction of irradiation of the linearly polarized X-ray so that the direction of an electric vector of the linearly polarized X-ray perpendicularly intersects a direction in which a high accuracy of the pattern shape is required.

2. A process according to claim 1, further comprising the step of utilizing the pattern shape in the production of one of a semiconductor device and a magnetic bubble memory device.

3. A process according to claim 1, wherein the linearly polarized X-ray is a synchrotron radiation (SR).

4. A process of X-ray lithography, comprising the steps of providing a linearly polarized X-ray, and irradiating a resist on a substrate through a mask with the linearly polarized X-ray to form a pattern shape with high accuracy, wherein the linearly polarized X-ray is a synchrotron radiation (SR) and the resist on the substrate is a micro resist for short wavelength, the step of irradiating including controlling the direction of irradiation of the linearly polarized X-ray so that the direction of an electric vector of the linearly polarized X-ray perpendicularly intersects a direction in which a high accuracy of the pattern shape is required and which is utilized for the production of one of a semiconductor device and a magnetic bubble memory device.

5. A process according to claim 4, wherein the semiconductor device is an MOS transistor.

* * * * *